United States Patent [19]
Jeng

[11] Patent Number: 5,912,843
[45] Date of Patent: Jun. 15, 1999

[54] SCALABLE FLASH EEPROM MEMORY CELL, METHOD OF MANUFACTURING AND OPERATION THEREOF

[75] Inventor: Ching-Shi Jeng, Los Altos Hills, Calif.

[73] Assignee: Integrated Memory Technologies, Inc., Santa Clara, Calif.

[21] Appl. No.: 08/791,863

[22] Filed: Jan. 31, 1997

Related U.S. Application Data

[63] Continuation-in-part of application No. 08/619,258, Mar. 18, 1996, Pat. No. 5,668,757.

[51] Int. Cl.$^6$ .......................... G11C 16/04; H01L 29/788
[52] U.S. Cl. .................. 365/185.14; 365/185.15; 365/185.29; 257/316; 257/319
[58] Field of Search .......................... 365/185.14, 185.15, 365/185.16, 185.18, 185.29; 257/316, 319, 320

[56] References Cited

U.S. PATENT DOCUMENTS

| | | | |
|---|---|---|---|
| 4,462,090 | 7/1984 | Iizuka | 365/185 |
| 4,531,203 | 7/1985 | Masuoka et al. | 365/218 |
| 4,698,787 | 10/1987 | Mukherjee et al. | 365/185 |
| 4,979,146 | 12/1990 | Yokoyama et al. | 365/185 |
| 4,989,053 | 1/1991 | Shelton | 365/185 |
| 5,029,130 | 7/1991 | Yeh | 365/185 |
| 5,036,017 | 7/1991 | Noda | 257/279 X |
| 5,194,925 | 3/1993 | Ajika et al. | 257/314 |
| 5,280,446 | 1/1994 | Ma et al. | 365/185 |
| 5,303,187 | 4/1994 | Yu | 365/185 |
| 5,394,357 | 2/1995 | Yu | 365/185.14 |

FOREIGN PATENT DOCUMENTS

| | | |
|---|---|---|
| 355087491 | 7/1980 | Japan . |
| 357091561 | 6/1982 | Japan . |
| 361131484 | 6/1986 | Japan . |

Primary Examiner—David C. Nelms
Assistant Examiner—Son Mai
Attorney, Agent, or Firm—Limbach & Limbach LLP; Ronald L. Yin

[57] ABSTRACT

A scalable flash EEPROM cell has a semiconductor substrate with a drain and a source and a channel therebetween. A select gate is positioned over a portion of the channel and is insulated therefrom. A floating gate has a first portion over the select gate and insulated therefrom, and a second portion over a second portion of the channel and over the source, and is between the select gate and the source. A control gate is over the floating gate and is insulated therefrom. A memory array using this memory cell is also disclosed.

26 Claims, 7 Drawing Sheets

SCALABLE FLASH EEPROM MEMORY CELL, METHOD OF MANUFACTURING AND OPERATION THEREOF

This is a continuation-in-part application of a application Ser. No. 08/619,258, filed on Mar. 18, 1996, now U.S. Pat. No. 5,668,757.

TECHNICAL FIELD

The present invention relates to an electrically erasable and programmable read-only non-volatile memory (EEPROM) cell or, more specifically, a flash EEPROM. The present invention also relates to a memory array containing a plurality of such EEPROM cells arranged in a matrix of rows and columns.

BACKGROUND OF THE INVENTION

One prior art flash memory device is a stack gate flash EEPROM where a single stack-gate transistor constitutes the memory cell. It programs as a traditional UW-erasable EPROM, using the mechanism of hot-electron injection to a floating gate, and erases through Fowler-Nordheim tunneling mechanism from the source region. Such device suffers the disadvantages of (1) over-erase sensitivity, where the memory cell can be erased to a negative threshold voltage thus rendering the cell in a conductive state even when the gate of the cell is deselected and biased at a ground potential, and (2) high programming current, which requires the memory cell to be programmed by a separate power supply voltage. See for example, U.S. Pat. No. 4,698,787.

A second type of flash memory device utilizes a split gate configuration. This eliminates the over-erase sensitivity, because even if the floating gate is over-erased, conduction in the channel requires the biasing of the control gate which is over another portion of the channel. However, the pro-gramming and erase mechanisms are the same as the stack-gate configuration. The disadvantage of this configuration is that it increases the cell size and suffers an alignment sensitivity because of the split gate arrangement. See for example, U.S. Pat. No. 5,029,130.

Yet another type of flash memory cell utilizes the so called source-side injection technique which minimizes the hot electron programming current to the extent that an on-chip voltage multiplier can be used to provide sufficient programming current from a single 5 or 3.3 V power supply. However, the structure of these cells still suffers from (1) alignment sensitivity, (2) poor scalability and (3) compromise between cell size and coupling ratio. See U.S. Pat. No. 5,194,925.

Finally, reference is made to U.S. Pat. Nos. 5,303,187, 4,462,090 and 5,280,446 each of which discloses a single transistor memory cell having four terminals with a select gate, a control gate, and a source and drain. The memory cell disclosed in U.S. Pat. No. 5,303,187, however, erases by tunneling of electrons from a floating gate to the substrate (see Col. 5, line 64–68). This is undesirable because of the lower coupling ratio, due to the large capacitance between the floating gate and the substrate. As a result, a higher voltage to erase is required. In addition, it requires a negative voltage to supply the potential for erase operation of an n-type cell. This requires the process to provide a high PMOS junction breakdown voltage, and a high field isolation threshold voltage and a low PMOS transistor body effect so that the circuit can provide a negative voltage of sufficient magnitude to achieve the necessary erase operation.

Each of U.S. Pat. No. 4,462,090 and 5,280,446 discloses a split gate configuration for the select gate. Such a split gate configuration for the select gate can cause punch through sensitivity due to misalignment.

SUMMARY OF THE INVENTION

In the present invention, an electrically erasable and programmable read only memory cell has a semiconductor substrate with a first region and a spaced apart second region, and a channel therebetween. The channel is of a first conductivity type, with said first region made by implanting dopants of a second conductivity type, and with said second region made by implanting dopants of said second conductivity type to a first level, and implanting dopants of said second conductivity type to a second level, deeper than said first level. A select gate is positioned over the substrate and is insulated therefrom and extends over a first portion of said channel. A floating gate has a first portion over the select gate and is insulated therefrom, and has a second portion over the substrate and is insulated therefrom and extends over a second portion of the channel between the select gate and the source. A control gate is over the floating gate and is insulated therefrom.

A memory array has a plurality of such electrically erasable and programmable read only memory cells arranged in a matrix defined by a plurality of rows and columns, with a plurality of column lines connecting certain of the same terminals of each memory cell in the same column, and a plurality of row lines connecting certain of the same terminal of each memory cell in the same row. A column decoding means receives a column address signal and selects one of a plurality of column lines in response thereto. A row decoding means receives a row address signal and selects one of a plurality of row lines in response thereto.

BRIEF DESCRIPTION OF THE DRAWINGS

FIG. 1(*b*) is a top layout view of the first embodiment of the cell of the present invention shown in FIG. 1(*a*), using a 1 μm CMOS design rule.

FIG. 5(*b*) is a top layout view of the fourth embodiment of the cell of the present invention shown in FIG. 5(*a*), using a 1 μm CMOS design rule.

DETAILED DESCRIPTION OF THE DRAWINGS

Figure 1A:
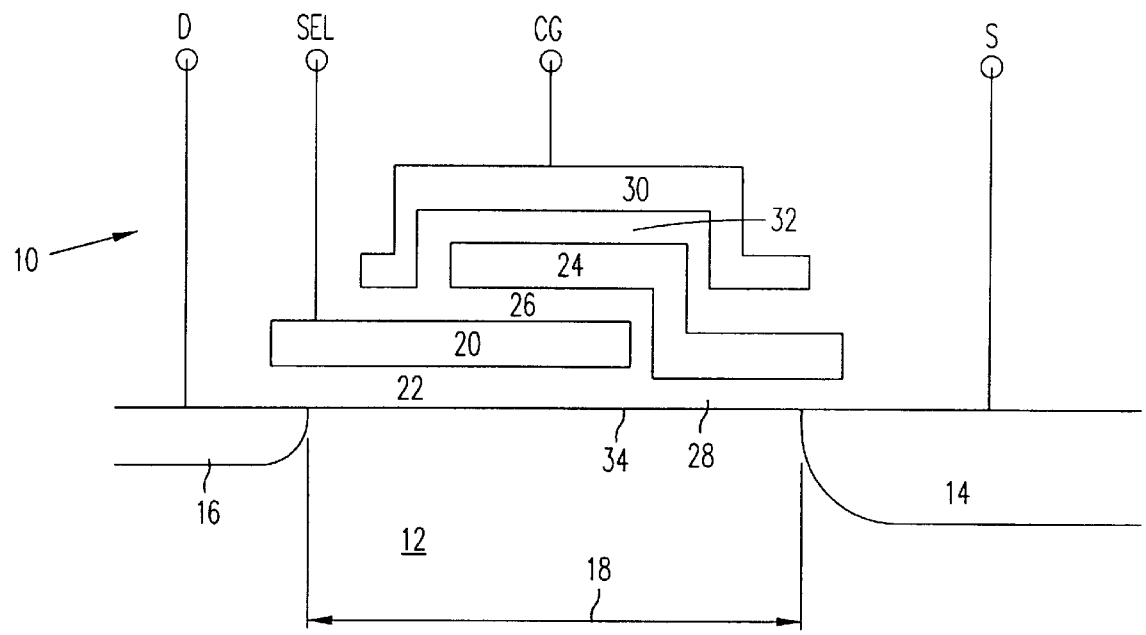
FIG. 1(*a*) is a schematic cross sectional view of a first embodiment of a memory cell of the present invention.

A preferred embodiment of memory cell 10 of the present invention is shown in FIG. 1(a). The memory cell 10 comprises a semiconductor substrate 12, with a source 14, a drain 16, and a channel 18 separating therebetween. A select gate 20, is positioned over a first portion 38 of the channel 18, separated therefrom by a first insulating layer 22. Although the select gate 20 is shown as overlapping a portion of the drain 16 in FIG. 1(a), it is not essential that the select gate 20 overlap the drain 16. The select gate 20 is the first polycrystalline silicon layer to be deposited over the substrate 12. Unlike the addressing gate shown and described in U.S. Pat. No. 4,462,090, the select gate 20, used in the memory cell 10 of the present invention is planar and hence is not subject to misalignment. The first insulating layer 22 can be of conventional insulating material, such as silicon oxide.

A floating gate 24, which is made from the second polycrystalline silicon layer, has two portions: a first portion, which is over the select gate 20, and is separated therefrom by a second insulating layer 26, and a second portion, which is over the substrate 12, and is separated therefrom by a third insulating layer 28. The second portion of the floating gate 24 extends over a portion of the channel 18, between the select gate 20 and the source 14. In addition, the second portion of the floating gate 24 extends over the source 14.

A control gate 30 is over the select gate 20, and the floating gate 24, and separated therefrom by a fourth insulating layer 32. The memory cell 10 is controlled by voltages supplied to the four terminals: source 14, drain 16, select gate 20, and control gate 24.

Figure 1B:
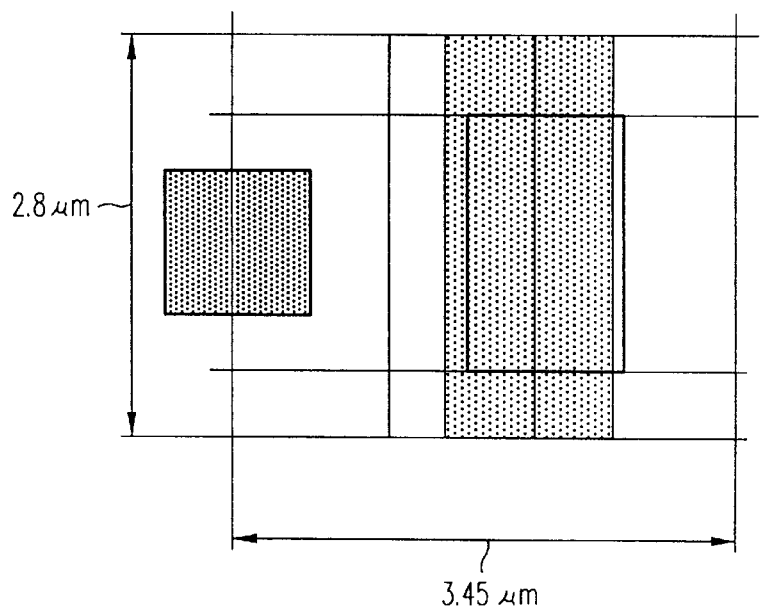

A layout drawing of the memory cell 10 is shown in FIG. 1(b), which is drawn based on the design rules of a 1 $\mu$m CMOS technology. Because of the scalability of the cell which will be discussed later, the cell dimension can be reduced in near direct proportion to the line width of a scaled technology. Using a 1 $\mu$m CMOS technology for example, the n+ drain region 16 can be 0.3 $\mu$m in depth; the n+ source region 14 can be 0.5 ~0.6 $\mu$m in depth; the first insulation film region 22 can be a 180 Å thermally grown $SiO_2$ film; the third insulation film region 28 can be a 100 Å thermally grown $SiO_2$ film; the second insulation film region 26 can be an ONO film with an equivalent thickness of 250 Å of $SiO_2$; the fourth insulation film 32 can be another ONO film with an equivalent thickness of 250 Å of $SiO_2$. The length of the select gate 20 can be 1 $\mu$m; the total floating gate 24 length can be 1.1 $\mu$m, with 0.5 $\mu$m overlapping on the select gate and 0.6 $\mu$m directly on the substrate; the length of the control gate 30 can be 1.1 $\mu$m, with 0.25 $\mu$m overlapping the select gate 20 and 0.85 $\mu$m overlapping the floating gate 24.

The memory cell 10 of the present invention can be manufactured generally in accordance with the following steps:

a) forming an isolated active device region, on a semiconductor substrate 12 of a first conduction type;

b) forming a first insulation film 22 on the active device region of the semiconductor substrate 12;

c) forming a select gate 20, through the first insulation film 22, on the active device region of the substrate which defines the first channel region;

d) forming a third insulation film 28 on the active device region which is not covered by the select gate 20, and a second insulation film 26 on the select gate 20;

e) forming a floating gate 24, through the third insulation film 28, on the semiconductor substrate 12 which defines the second channel region, and, through the second insulation film 26, on the select gate 20;

f) forming the fourth insulation film 32 on the select gate 20 and floating gate 24;

g) forming the control gate 30, through the fourth insulation film 32, on the select gate 20 and floating gate 24;

h) forming the source region 14 and drain region 16 by doping the source and drain regions, 14 and 16 respectively, by ion implantation of a second conductor type, such as arsenic. Typically, spacers are placed adjacent to the floating gate 24 and the select gate 20. The arsenic is implanted at a concentration of approximately $1\times10^{15}$ to $1\times10^{16}$ ions/cm$^2$, and an implant voltage of 30 kev to 80 kev. Because of the presence of the spacers, which is required to form the LDD junction of the periphery transistors for reducing hot electron effects of short channel transistors, the implanted arsenic will have little or no overlap with the floating gate 24. Thereafter, lateral diffusion of the arsenic implant will bring the arsenic dopant to a region substantially near the side wall of the floating gate 24 and select gate 20. However, the overlap between the floating gate 24 and the source region 14 is not sufficient to permit Fowler-Nordheim tunnelling of a magnitude required for the operation of the cell of the present invention. Thus, a second implant is required to form a deeper source region 14 which overlaps to a greater degree with the floating gate 24;

i) forming the source region 14 which is overlapped by a portion of the floating gate 24, by implanting ions of a second conductivity type, such as phosphorus, with or without the presence of the spacer adjacent to the side wall of the floating gate 24 and then causing lateral diffusion of the ion implantation in the source region 14, through thermal diffusion. The phosphorus is implanted at a concentration of approximately $1\times10^{14}$ to $1\times10^{16}$ ions/cm$^2$, at a voltage of approximately 30 to 80 kev. The implanted phosphorous forms a deeper source region 14 than the drain region 16, because phosphorous has a 1.5 to 2 times deeper implant range and 2 to 3 times higher diffusion constant than that of arsenic. The deeper source junction causes greater overlap with the floating gate 24, which provides the tunneling area for erase operation. The higher concentration of source region with phosphorous implant also minimizes the voltage drop between the source node and the source-to-tunnel oxide interface region, so that higher tunneling current can be induced. Another reason to have a deeper source junction is that it will have a higher grounded gate or negative gate assisted junction breakdown voltage, and more importantly it will have a lower band-to-band tunneling current which causes leakage from source junction to the substrate. The band-to-band tunneling current will present an excessive load to the on-chip voltage multiplier causing difficulty for low $V_{cc}$ operation.

Erase or Write "1"

To write a "1" or to erase a memory cell 10, which causes the memory cell 10 to be in a conductive state, a high voltage of, for example, 12 V is applied to the source S 14. The drain D 16, select gate SEL 20 and control gate CG 30 are all at ground potential. Because of the high capacitive couplings between the floating gate 24 and the select gate 20, and between the floating gate 24 and the control gate 30, and because of a fairly small capacitive coupling between the source region 14 and the floating gate 24, and because of the overlap between the source region 16 and the floating gate 24, a large percentage of the applied voltage appears across the source 14 and floating gate 24. This causes the electrons to tunnel from the floating gate 24 to the source 14, but not to the substrate, through the Fowler-Nordheim tunneling mechanism.

Figure 2:
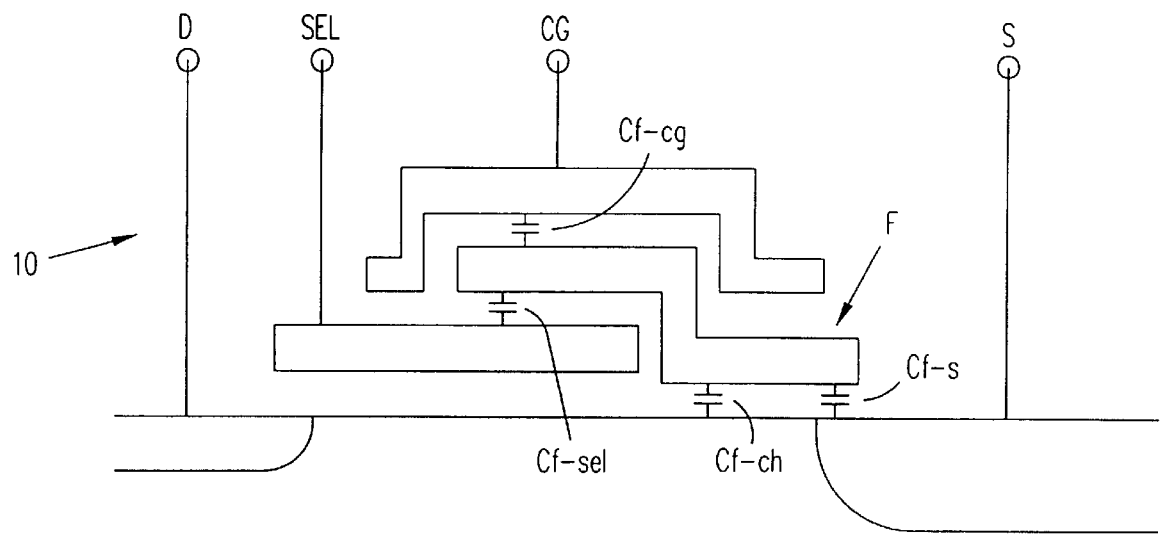
FIG. 2 is a schematic cross sectional view of the first embodiment of the memory cell shown in FIG. 1(*a*), showing the principle coupling capacitors.

The capacitive coupling elements are shown in FIG. 2. The voltage differential between the floating gate and source, $\Delta V_{f-x}$, can be expressed as:

$$\Delta V_{f-s}=V_s\ (C(f-cg)+C(f-sel))/(C(f-cg)+C(F-sel)+C(f-s))=V_s\ Re$$

Where

Re is the coupling ratio during erase operation, and
Re=(C(f-cg)+C(f-sel))/(C(f-cg)+C(f-sel)+C(f-s)) Vs is the source voltage;

C(f-cg) is the total coupling capacitance between the floating and control gate;

C(f-sel) is the total coupling capacitance between the floating and select gate;

C(f-s) is the total coupling capacitance between the floating gate and source.

With the dimensions given above, the erase coupling ratio, Re, is 89%. Since Vs is 12V, a total of 10.68 V appears across the 100 Å tunneling oxide (i.e. third insulating film 28) which is sufficient to induce a significant tunneling current from the source 14 to the floating gate 28 and cause the floating gate 28 to be positively charged.

With source voltage at 12V, a band-to-band tunneling mechanism may occur at the source junction which will increase the magnitude of the source current. Since an on-chip voltage multiplier is usually used for supplying the high voltage, the band-to-band tunneling current will require a more robust voltage multiplier design.

An alternative way to erase the cell 10 is to apply a negative bias (~-8 to -10 V) to the control gate 30, while holding the select gate 20 at ground potential or the same negative gate bias as the control gate 30 and raise the voltage at the source 14 only to 5 V or close to Vcc, such as 6–7 V. The advantage of this approach is that the source voltage is now at a lower potential. By reducing the source voltage, it allows one to supply the source voltage either directly from the Vcc power supply or from a voltage multiplier with fewer pumping stages for higher current supply capability.

Program or Write "0"

To write a "0" to a memory cell 10, which causes the memory cell 10 to be in a non-conductive state, a high voltage of, for example, 5 to 8 V is applied to the source S 14. A second high voltage of 10 to 12 V is applied to the control gate 30. The drain voltage is kept at 0 V or a small bias voltage on the order of 0.3 to 1.0 volts. A small voltage which is just above the threshold voltage Vt of the transistor under the select gate 20, e.g. Vt+6V where ΔV~0.1V to 0.5V, is applied to the select gate 20. The voltage at the select gate 20 causes the transistor to conduct a small current, on the order of micro amperes, from drain 16 to source 14. Because of the high voltages which are applied the control gate 30 and source region 14, the potential at the floating gate 24 is coupled high. The floating gate voltage, Vf can be obtained by the following equation:

$$Vf=(Vcg*C(f-cg)+Vsel*C(f-sel)+Vs*C(f-s))/(C(f-cg)+C(f-sel)+C(f-s))$$

Where,

Vcg is the voltage applied to the control gate 30;

Vsel is the voltage applied to the select gate 20;

Vs is the voltage applied to the source 14;

C(f-cg), C(f-sel) and C(f-s) are the same as those defined previously.

By applying Vcg=12 V, Vs=8 V and Vsel=1V, then Vf =9.1 V. This potential will cause the channel near region 34 to be pulled high. The surface potential of the substrate 12 immediately below the left edge of the portion of the floating gate 24 over the channel 18, is estimated to be about one volt below the floating gate voltage or 8 V. Due to the fact that the select transistor is biased to just above the threshold voltage, the channel potential below the select gate 20 is close to that of the drain voltage, which is 0 V or a small bias voltage, as discussed previously. Hence a voltage differential of approximately 8 V is developed across the region in the channel 18 immediately below the select gate 20 and the region in the channel 18 immediately below the floating gate 24. The width of the gap between the region of the channel immediately below the select gate 20 and the region of the channel immediately below the floating gate 24 is approximately 200 to 400 Å. An electric field of 2 to 4 MV/cm is thus developed, which is high enough to cause hot electron injection from the channel 18 to the floating gate 24 and to charge the floating gate 24 to a non-conductive state.

The capacitive coupling elements of the memory cell 10 are formed by the overlapping areas between the select gate 20 and the floating gate 24, between the floating gate 24 and the control gate 30, and between the source region 14 and the floating gate 24. These areas are either vertically stacked or formed along the side walls. The coupling ratios of the memory cell 10 will not degrade as that of the conventional cell due to scaling because the ratio of the vertically stacked components are independent of scaling and the capacitance of the side wall components only depend on the thickness of the polysilicon gates, not the scaling dimension.

Because of the high coupling ratio provided by both the select gate 20 and control gate 30 to the floating gate 24, the width of the floating gate 24 does not have to be wider than that of the active diffusion region as shown in FIG. 1(b). For this reason, the size of the memory cell 10 can be comparable to or less than the size of a conventional stack-gate type flash cell, which requires certain overlap between the floating gate and the field oxide area to increase the coupling ratio.

Further, due to the split-gate structure, the memory cell 10 does not have the over-erase problem of the stack-gate cells. In addition, a unique feature of the memory cell 10 is that the select gate 20 length can be defined to be the minimum line width. Unlike the conventional split gate construction, the memory cell 10 is completely insensitive to alignment variations. This eliminates the punch-through and leakage problems which are commonly seen in the conventional split-gate type flash memory cells, exemplified by that shown in U.S. Pat. No. 5,029,130. Therefore, the memory cell 10 is superior to both the conventional stack and split gate cells.

Due to the nature of low programming and erase currents, the high voltages required for both the programming and erase operations can be supplied by an on-chip voltage multiplier. The voltage multiplier can be operated from a single 5V, 3.3V or lower power source. Hence this cell allows the memory array to be operated from a single power source of 5, 3.3 or lower voltage.

Figure 3:
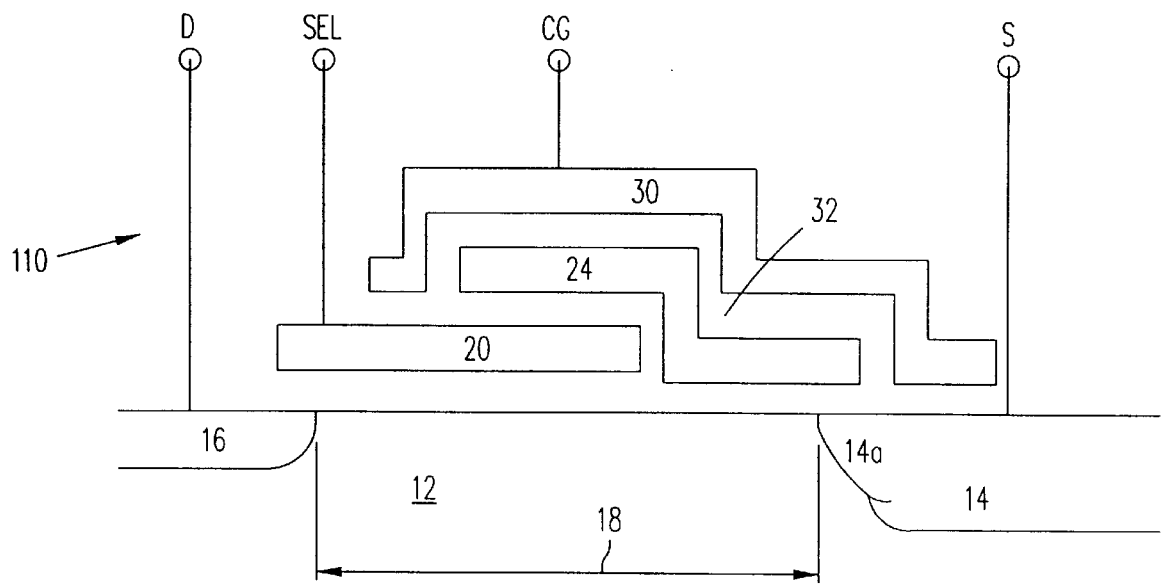
FIG. 3 is a schematic cross sectional view of a second embodiment of a memory cell of the present invention.

A second embodiment of a memory cell 110 of the present invention is shown in schematic cross sectional view in FIG. 3. The memory cell 110 has the same components as that of the embodiment shown in FIG. 1(a). Therefore, the same number will be used to designate like parts. The only difference between the second embodiment shown in FIG. 3 and the first embodiment shown in FIG. 1(a) is that the control gate 30 wraps around the floating gate 24, and extends over the source region 14, but is insulated therefrom. The advantages of the memory cell 110 are two folds: (1) the control gate 30 wraps around the floating gate 24 completely so that mis-alignment between the control gate 30 and the floating gate 24 will not affect the coupling ratio of the cell 110. (2) The tunnel oxide region, i.e. the portion of the third insulating layer 28 located near the edge of the floating gate 24, over the source region 14 is usually very vulnerable to damages induced by the source region ion implantation process. With the control gate 30 wrapped completely around the floating gate 24 including the corner, it serves to protect the integrity of the tunnel oxide. However, in order for the source junction to reach a level below the tunnel oxide region, a n region 14a is formed prior to the deposition of the control gate 30. The formation of the n region 14a is done by direct ion implantation after the floating gate 24 is formed and before or after the fourth insulating layer 32 is formed. The implanted species can be AS or $P^+$. Thermal drives are followed to cause the implant species to diffuse to a region under the floating gate.

Figure 4:
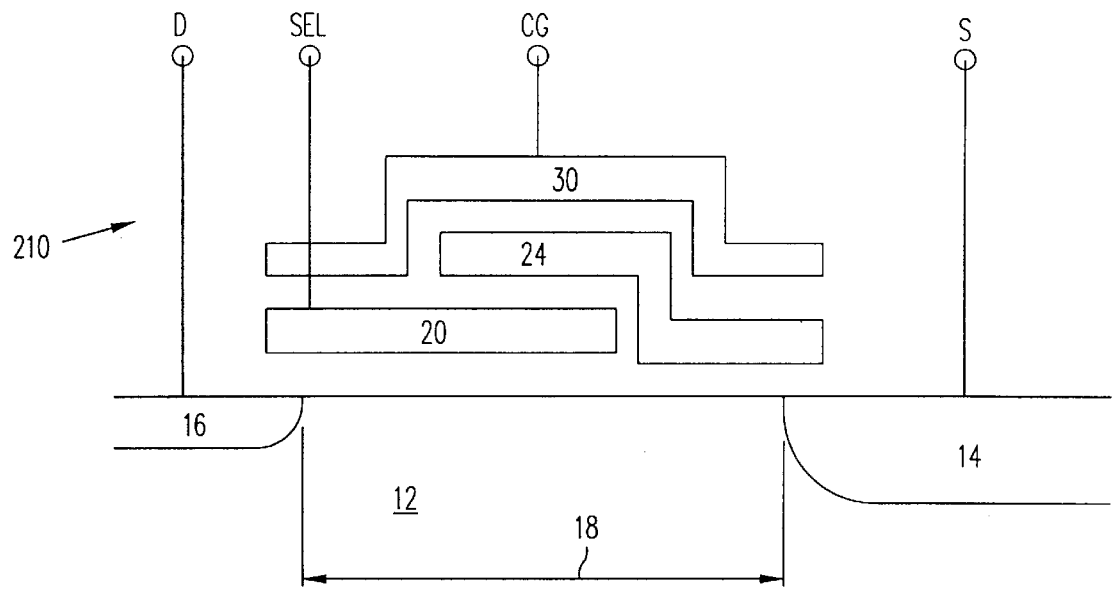
FIG. 4 is a schematic cross sectional view of a third embodiment of a memory cell of the present invention.

A third embodiment of a memory cell 210 of the present invention is shown in schematic cross sectional view in FIG. 4. Again, since the memory cell 210 is similar to the memory cell 110 and memory cell 10, like parts will be designated with like numerals. The only differences between the memory cell 210 from the memory cell 110 and the memory cell 10 are: 1) the control gate 30 of the memory cell 210 has one edge aligned with an edge of the select gate 20 over the drain region 16; and 2) the control gate 30 of the memory cell 210 has another edge aligned with an edge of the floating gate 24, over the source region 14.

Prior to the formation of the control gate 30, the select gate 20 and the floating gate 24 are defined so that the left edge of the select gate 20 and the right edge of the floating gate 24 extend beyond the final dimension of the control gate 30. After the control gate 30 is defined, the control gate 30 is used as the etching mask to etch the left edge of the select gate 20 and the right edge of the floating gate 24. The main advantage of the memory cell 210 is that the cell size is smaller than the memory cells 110 and 10. The draw back is that the length of the select gate 20 is a function of the mis-alignment between the control gate 30 and the select gate 20, and the length of the floating gate 24 is a function of the mis-alignment between the control gate 30 and the floating gate 24.

Figure 5A:
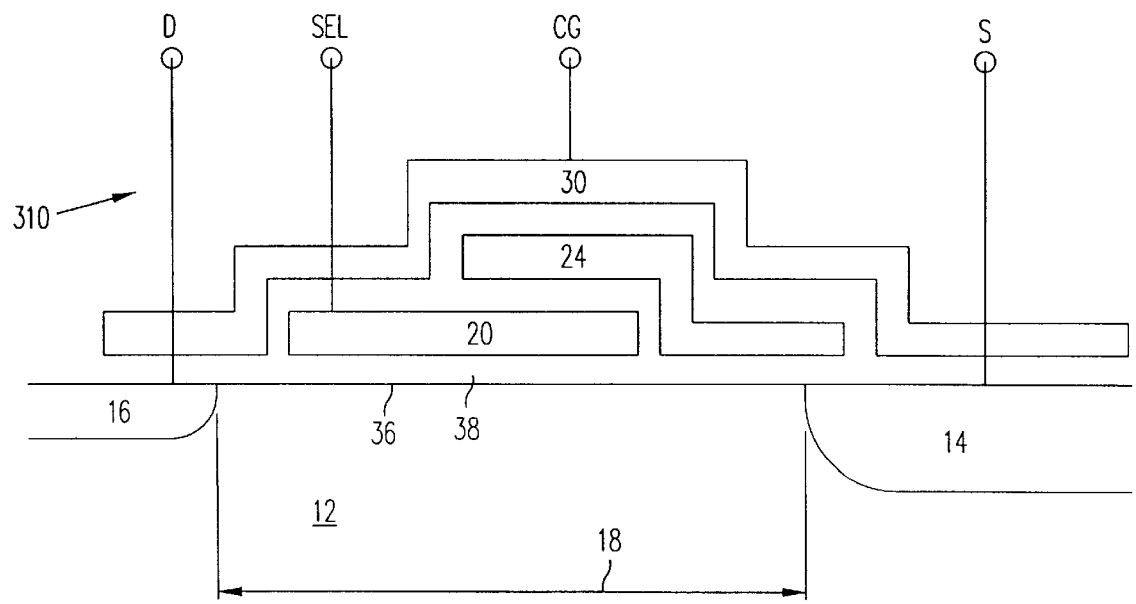
FIG. 5(*a*) is a schematic cross sectional view of a fourth embodiment of a memory cell of the present invention.
Figure 5B:
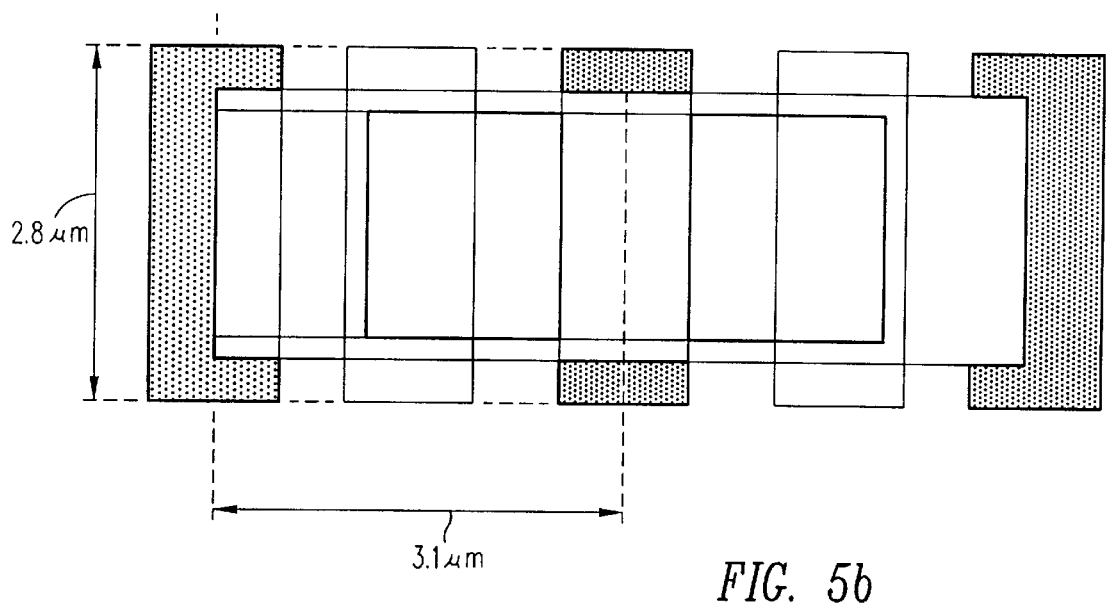

A fourth embodiment of a memory cell 310 is shown in schematic cross sectional view in FIG. 5(a). Again, since the memory cell 310 is similar to the memory cells 210, 110 and 10, like parts will be designated with like numerals. The difference is that the channel 18 is divided into three regions. As before, a select gate 20, is positioned over a first portion 38 of the channel 18, separated therefrom by a first insulating layer 22. A floating gate 24 has a first portion over the select gate 20 and is insulated therefrom, and has a second portion over the substrate 12 and is insulated therefrom and extends over a second portion 37 of the channel 18, between the select gate 20 and the source 14. A control gate 30 has a portion over the floating gate 24 and is insulated therefrom, a portion over the select gate 20 and is insulated therefrom, and is over a third portion 36 of the channel 18, and is insulated therefrom. In addition, the control gate 30 extends over the drain region 16, with the contact to the drain region 16 eliminated. Access to the drain region 16 is accomplished by a drain line in the substrate 12. The layout drawing of the fourth embodiment is shown in FIG. 5(b). With the memory cell 310, the control gate 30 serves also as the word line of the memory array. The memory cell 310 is selected when the control gate 30 is biased to a high voltage, or Vcc, which turns on the portion 36 of the channel 18, directly beneath the control gate 30. The select gate 20 will be biased so that the portion 38 of the channel 18 is always on during read. The memory cell 310 is programmed and erased in the same mechanism as described for the memory cells 210, 110, and 10.

Figure 6:
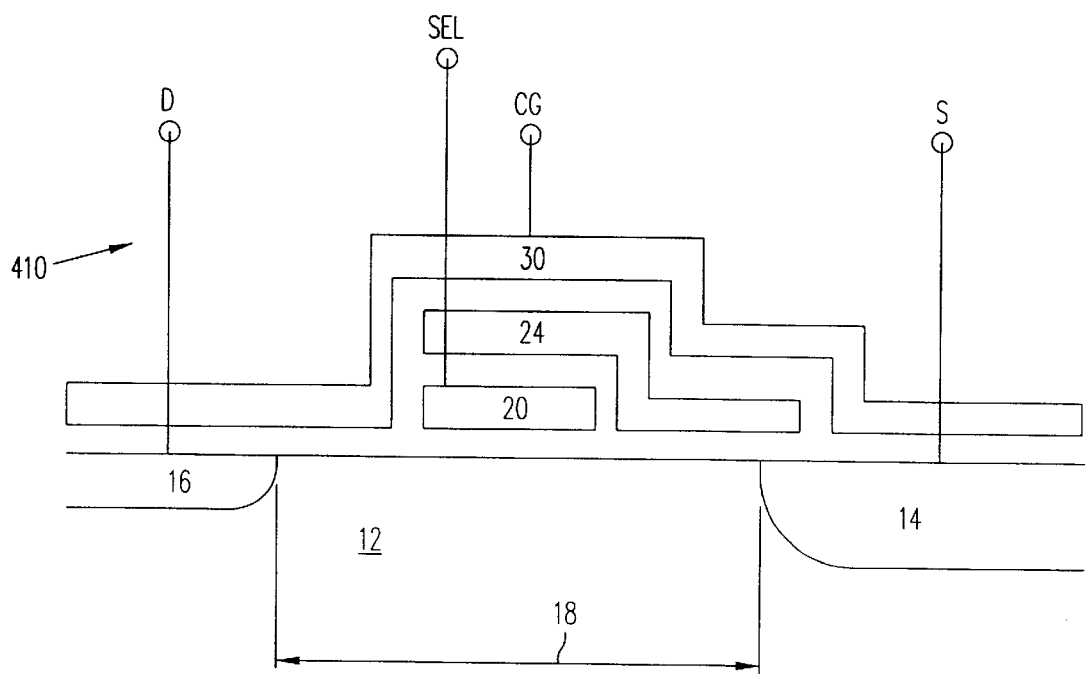
FIG. 6 is a schematic cross sectional view of a fifth embodiment of a memory cell of the present invention.

A fifth embodiment of a memory cell 410 of the present invention is shown in schematic cross sectional view in FIG. 6. The memory cell 410 is similar to the memory cell 310. The only difference between the memory cell 410 and the memory cell 310 is that the select gate 20 has an edge which is aligned with an edge of the floating gate 24, using a similar self-aligned technique described for the memory cell 210. Thus, the control gate 30 is directly over the floating gate 24 and the channel 18, but not directly over the select gate 20. Similar to the embodiment of the memory cell 310, the memory cell 410 has a channel with three portions 36, 37, and 38, with the select gate 20, floating gate 24, and control gate 30 over the three portions 38, 37, and 36, respectively. The operation principle of the memory cell 410 is the same as that of the memory cell 310.

Memory Array

Figure 7:
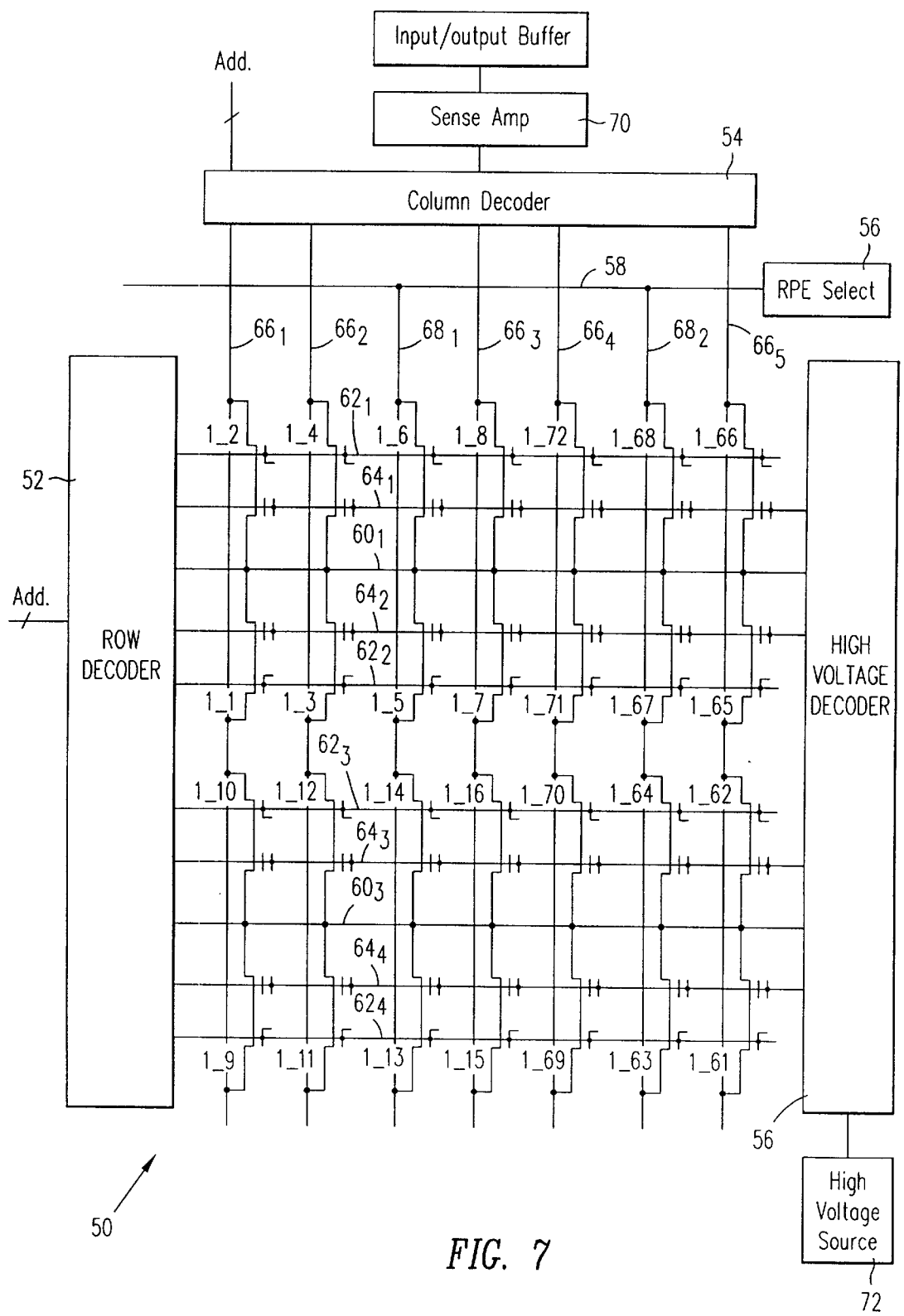
FIG. 7 is a block level schematic circuit diagram of a first embodiment of a memory array of the present invention, using any of the embodiments of the memory cell of the present invention shown in FIGS. 1(*a*), 3, or 4.

A number of different memory arrays can be constructed for the memory cells 410, 310, 210, 110, and 10. A first embodiment of a memory array 60 is shown in FIG. 7. The memory array 60 is suitable for use with the memory cells 10, 110 and 210.

The memory array 50 is comprised of a plurality of memory cells 10, 110 or 210, arranged in a matrix of a plurality of rows and columns. The memory array 50 has a plurality of column lines $66_{1 \ldots n}$ and a plurality of first row lines $62_{1 \ldots n}$, a plurality of second row lines $64_{1 \ldots n}$, and a plurality of third row lines $60_{1,3, \ldots (2n-1)}$. Each column line 66 is connected to the drain region 16 of the memory cells 10, 110 or 210 arranged in that column. One of a plurality of first row lines 62 connects the select gate 20 of all the memory cells arranged in that same row. One of a plurality of second row lines 64 connects the control gate 30 of all the memory cells arranged in that same row. Finally, one of a plurality of third row lines 60 connects the source regions 14 of all the memory cells arranged in that same row. Thus, for each row of memory cells, there are three row lines: a first row line 62 connecting all the select gates 20, a second row line 64 connecting all the control gates 30, and a third row line 60 connecting all the source regions 14. However, as shown in FIG. 7, two immediate adjacent rows of memory cells share a common third row line 60 connecting to the source regions 14 of the memory cells of both rows.

The array 50 also comprises a column decoder 54 which receives and decodes a column address signal and selects one of the plurality of column lines 66. The array 50 has a row decoder 52 which receives and decodes a row address signal and selects a first, second and third row lines. The array 50 also has a high voltage decoder 56 which supplies the high voltages from a high voltage source 72 to the second row line 64 and third row lines 60 of the selected cell. A PRE (Program Read Erase) Select circuit 56 supplies a PRE signal 58 to pre-selected columns 68 in the cell array 50. Typically one out of every 16 cell columns is selected to receive the PRE signal 58. All the memory cells in the same column 68 are of the same type of floating gate memory cells 10, 110, or 210, as are connected to the columns 66. Further, the memory cells connected to the column 68 are programmed to the same conductive state and cannot be electrically altered by a user. They function to supplied the voltage from the PRE circuit 56 to the various row lines 62, 64 and 60 during the operations of Program, Read and Erase. Therefore, in another embodiment of the present invention, the memory cells in the column 68 may be wider than the memory cells in the other columns 66, in order to increase conductivity. The operation conditions of the cell array 50 are as follows:

Array Bias Conditions and Disturb Considerations

Erase Operation

There are two possible erase operations.

A first erase operation allows one to erase only the two adjacent rows of memory cells that share the same source line 60. This erase operation or write to "1" is accomplished by applying a high voltage (~10 to 12 V) to one of the selected third row line, e.g. $60_1$ (connected to the source regions 14). The corresponding second row lines $62_1$ and $62_2$ and first row lines $64_1$ and $64_2$ of the memory cells whose source is at the high voltage, are held at ground potential. All column lines 66 and the PRE lines 68 are biased at ~Vcc or floating. All the other unselected rows are biased with the first (select), second (control gate) and third row lines (source) equal to 0 V. In this manner all of the memory cell in the two rows connecting to the selected third row line $60_1$ are erased, simultaneously. With this first erase operation, the other unselected row lines are not disturbed.

A second erase operation allows one to erase only one of the two adjacent rows of memory cells that share the same source line 60. A negative bias (~-8 to -10 V) is applied to only one of the second row lines (i.e. to the control gate) of the selected row of memory cells, e.g. $64_1$, while holding the corresponding first row line (i.e. to the select gate) of the selected row of memory cells, e.g. $62_1$, at ground potential and the selected third row line (i.e. source line), e.g. $60_1$ at 5 V or close to Vcc. The other first row line $62_2$ and second row line $64_2$, of the row of cells that share the same selected third row line $60_1$ are grounded or biased to zero volts. All column lines 66 and the PRE lines 68 are biased at ~Vcc or floating. All the other unselected rows are biased with the source, select and control lines equal to 0 V. In this operation, there is a slight disturbance to the row of cells that share the same selected third row line, e.g. $60_1$. However, the disturbance is usually negligible because the magnitude of the negative bias on the selected second row line $64_1$ is higher than the magnitude of the corresponding selected third row line $60_1$. The advantage of this second method is that the erase sector can be made smaller. Of course, the voltages applied to the other first row line $62_2$ and second row line $64_2$, of the row of cells that share the same selected third row line $60_1$ can be the same as the selected first row line $62_1$ and second row line $64_1$, respectively. In that event the two rows of memory cells, sharing the same common selected third row line 60 are erased simultaneously, as in the first method.

Program Operation

The program operation is done by raising the selected second row line, i.e. control line, e.g. $64_1$ to ~10 to 12V and the selected corresponding first row line, i.e. select line, e.g. $62_1$ to slightly above the threshold of the select transistor, e.g. Vt+ΔV. The corresponding third row line, i.e. source line, e.g. $60_1$ is biased at 5 to 10V. The selected column line, e.g. $66_2$ is biased at 0 V. All the unselected column and all the PRE lines are at ~Vcc or Vcc–Vt, thus preventing the select transistor of the unselected cells in the selected row from being turned on. Hence no programming action is done to the unselected cells in the selected row. The second row lines 62, i.e. select line, of all the unselected rows are biased at 0 V, thus preventing the cell from being programmed. The memory cells in the PRE column 68 are never programmed and always remain in the erased or conducting states.

Two potential disturb conditions exist. One is related to the unselected cells in the selected row. The floating gate potentials of the unselected cell are coupled high by the control and source lines, while the select line is at ~Vt+ΔV. The potential difference between the select line and floating gate may cause negative charge injection from the select gate to the floating gate. This disturb condition can be successfully suppressed by forming a thick insulation layer (20 to 40 nm) between the side wall of the select gate and the floating gates. The phenomenon of enhanced tunneling due to sharp point at the edge of the select gate is a concern, but it can be prevented by controlling the edge and corner profile through processing steps.

The other potential disturb condition is related to the cells in the row which shares the same source line as the selected row. With the source line raised to 5 to 8V, it is possible that the floating gate charge of the unselected cells may be disturbed due to electron tunneling from the floating gate to source line. Since the control gate of this unselected row is also biased at 10 to 12 V, the voltage difference between the floating gate and source is not significant enough to fatally disturb the unselected cells over the duration of programming the complete row.

Read Operation

During read, the source lines, i.e. third row lines 60, of the entire array 50 are grounded through the row decoder 52 or through the PRE lines 68, as discussed hereinafter. The control gates, all second row lines 64, of the entire array 50 are biased at 0 to 2 V. The unselected column lines 66 are grounded or biased at floating. The PRE lines 68 are grounded. The selected first row line 62, i.e. select line, e.g. $62_1$ is biased at Vcc or Vcc–Vt. The selected column line 66, e.g. $66_2$ is biased at 1 to 3 V. All other first row lines 62 which are not selected are biased at 0. If a selected cell has its floating gate programmed to "0", the negative charges on the floating gate, especially the portion over the channel region 18 causes the channel not to conduct, thereby causing little or no electrons to flow from the drain 16 to the source 14. If a selected cell has its floating gate programmed to "1", the positive charges on the floating gate, especially the portion over the channel region 18 causes the channel to conduct, thereby causing electrons to flow from the drain 16 to the source 14. Either of these two conditions can be detected by the sense amplifier 70.

Since the cells in the columns which are connected to the PRE line 68 have never been programmed and always remain in the conducting states, the bit lines of the PRE columns 68 act as additional ground line for the selected cell. The source lines 60 are connected to the PRE line 68 and to the PRE select signal line 58 to the PRE circuit 56 which is connected to ground, during the read operation. The use of the PRE column lines 68 greatly reduce the effective source line resistance of the array 50 and increase the performance of read operation.

Because of the low biases, the read disturb is low enough to ensure a product life of much more than the 10 years specification for a typical flash memory product.

|  | Erase Alternative #1 | Erase Alternative #2 | Program | Read |
|---|---|---|---|---|
| Selected Cell | | | | |
| Select Line ($62_1$) | 0 | 0 | Vt + ΔV1 | ~Vcc |
| Control Line ($64_1$) | 0 | ~−8 to −10 V | ~10 to 12 V | ~0 to 2 V |
| Selected Bit Line ($66_2$) | ~Vcc or floating | ~Vcc or floating | 0 or ΔV2 | ~1 to 2 V |
| Unselected Bit Lines | ~Vcc or floating | ~Vcc or floating | ~Vcc | 0 or floating |
| Source Line ($60_1$) | ~10 to 12 V | ~5 V or Vcc | ~5 to 10 V | 0 |
| Adjacent row with same source line | | | | |
| Select Line ($62_2$) | 0 | 0 | 0 | 0 |
| Control Line ($64_2$) | 0 | ~−8 to −10 V or 0 if unselected | ~10 to 12 V | ~0 to 2 V |
| Selected Bit Line ($66_2$) | ~Vcc or floating | ~Vcc or floating | 0 or ΔV2 | ~1 to 2 V |
| Unselected Bit Lines | ~Vcc or floating | ~Vcc or floating | ~Vcc | 0 or floating |
| All other unselected rows | | | | |
| Word line or Select Line | 0 | 0 | 0 | 0 |
| Control Line | 0 | 0 | 0 | 0 |
| Selected Bit Line | ~Vcc or floating | ~Vcc or floating | 0 or ΔV2 | ~1 to 2 V |
| Unselected Bit Lines | ~Vcc or floating | ~Vcc or floating | ~Vcc | 0 or floating |
| Source Line | 0 | 0 | 0 | 0 |
| PRE Signal (52) | ~Vcc or floating | ~Vcc or floating | ~Vcc | 0 |

Figure 8:
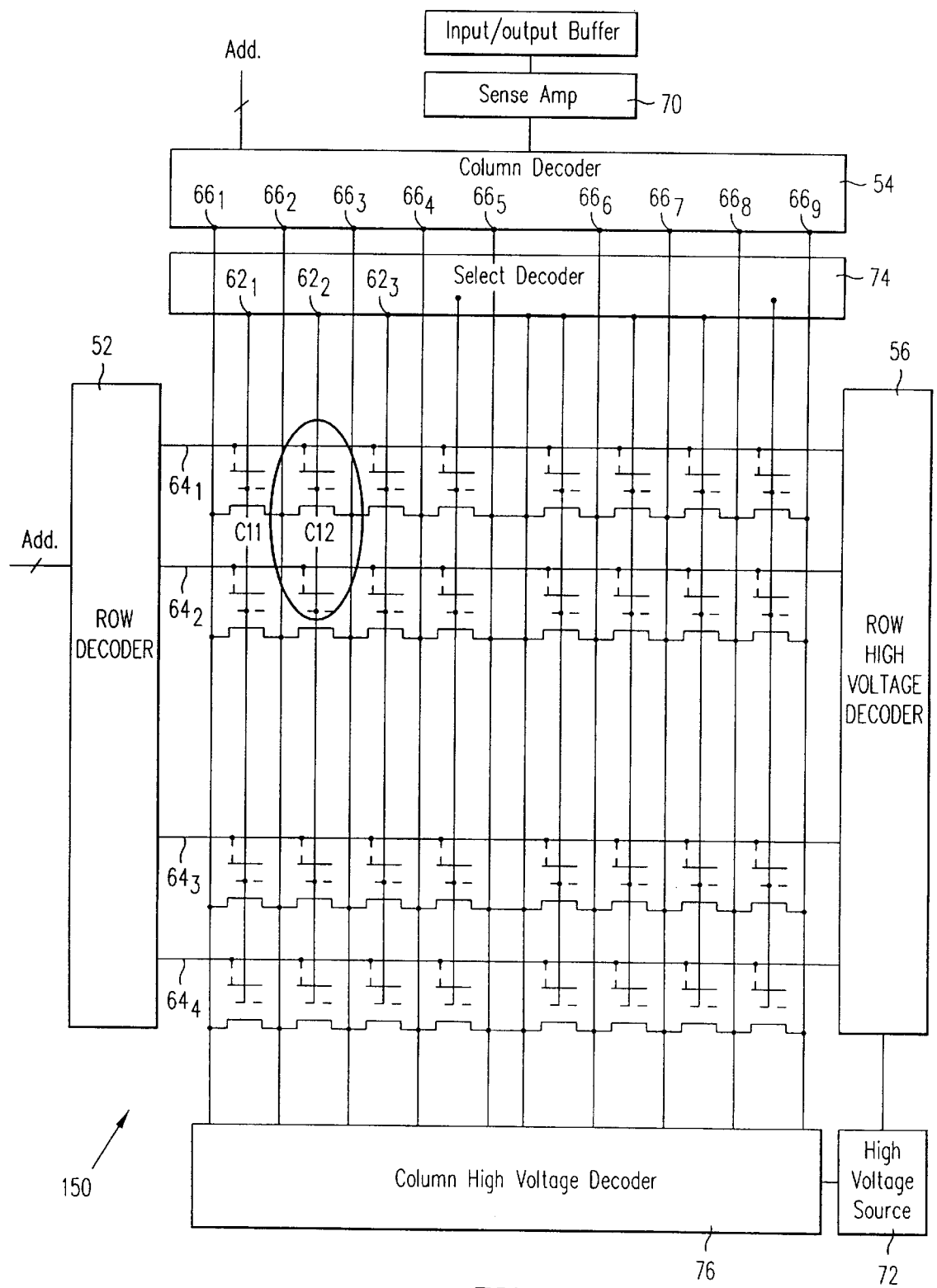
FIG. 8 is a block level schematic circuit diagram of a second embodiment of a memory array of the present invention, using any of the embodiments of the memory cell of the present invention shown in FIGS. 5(*a*), or 6.

A schematic circuit of a second embodiment of a memory array 150 of the present invention is shown in FIG. 8. The memory array 150 is suited for use with the memory cells 310 and 410.

The memory array 150 is similar to the array 50, and same numerals will be used to designate like parts. The array 150 is comprised of a plurality of memory cells 310 and 410, arranged in a matrix of a plurality of rows and columns. The memory array 150 has a plurality of first column lines $66_1 \ldots n$ and a plurality of second column lines $62_{1 \ldots n}$, and a plurality of row lines $64_{1 \ldots n}$. Each first column line 66 is connected to the drain region 16 of the memory cells 310 or 410 arranged in that column and to the source region 14 of the memory cells 310 or 410 arranged in a column, immediately adjacent thereto. Thus, one column line, e.g. $66_2$ is shared between the cells in column 1 (serving as the connection to the source regions 14 of the cells in that column), and the cells in column 2 (serving as the connection to the drain regions 16 of the cells in that column). Each of the second column lines 62 is connected to the select gate 20 of the memory cells in that column. Thus, for each of the memory cells arranged in the same column, e.g. column$_x$ there are three column lines, a first column line $66_x$ connecting the drain regions 16 of the cells in that column$_x$, a second column line $62_x$ connecting the select gate 20 of the cells in that column$_x$, and another first column line $66_{x+1}$ connecting the source regions 14 of the cells in that column$_x$. Each of the row lines 64 is connected to the control gate 30 of the memory cells in that row. Thus for each memory cells arranged in the same row, e.g. row$_y$, a row line $64_y$ connects all of the control gates 30 of all the cells in that row$_y$.

The array 150 also comprises a column decoder 54 which receives and decodes a column address signal and selects one of the plurality of first column lines 66. The array 150 has a row decoder 52 which receives and decodes a row address signal and selects a row line 64. The array 150 also has a select decoder 74 which also receives the column address signals and selects one of the second column lines 62. A row high voltage decoder 56 is connected to the row lines 64 and supplies the high voltages from a high voltage source 72 to the selected row line 64. A column high voltage decoder 76 is connected to the first column lines 66 and supplies the high voltages from the high voltage source 72 to the selected first column line 66. The operation conditions of the memory array 150 are as follows:

Erase

The erase operation can erase one column at a time or multiple columns simultaneously. To erase the column represented by the selected cell C12, the first column line 663 to the right of the column of cells is raised to ~10 to 12V, while all the other first column lines 66 are held floating. All of the row lines 64, i.e. lines which connect to the control gates 30 of all the cells in the array 150 are grounded. In addition, all of the second column lines 62, i.e. lines which connect to the select gates 20 of the cells in the array are at ground.

As previously discussed, in an alternative erase method which minimizes the loading of the on-chip voltage multiplier due to band-to-band tunneling current, a negative potential, on the order of −8 to −10 V may be applied to the selected row line, e.g. $64_1$. Further, the voltage applied to selected bit line, e.g. $66_3$ connecting the source regions 14 of the selected cells in the same column, may be reduced to 5 V or Vcc. In such case, the unselected column may be disturbed because of the negative voltage on the row line connecting to the control gate 30. One can then increase the erase block size to include all the columns. This approach is suitable for erasure of a large block of memory cells. The memory array 150 can be partitioned so that it is comprised of such erase blocks.

Program

To program the cell C12, the selected row line, e.g. $64_1$ is raised to ~10 to 12 V. The first column line 66 connecting the source region 14 of the selected cell, e.g. $66_3$, is raised to ~5 to 10V. The second column line 62 connecting the select gate 20 of the selected cell, e.g. $66_2$ is biased to Vt+ΔV, causing the cell to be programmed. All the unselected row lines, 64 are grounded, which prevent the cells in the unselected row from been programmed. All the unselected second column lines 62 are grounded, which prevents the cells in the unselected columns to be programmed. It should be pointed out that within the selected row, multiple cells at alternating columns can be programmed simultaneously by biasing the left column bit line $66_x$ (connecting to the drain regions 16)

to ground, biasing the right column bit line $66_{x+1}$ (connecting to the source regions 14) to ~5 to 10V, and biasing the second column line $62_x$, (connecting to the select gate 20) to Vt+ΔV.

Read

To read the cell C12, the selected row line $64_1$ is raised to Vcc. All the first column lines 66 are grounded except the selected left column bit line $66_2$, (connecting the drain region 16), which is raised to 1 to 2 V. The selected second column line $62_2$ is raised to Vcc. All the unselected second column lines 62 are grounded. As previously discussed, the charges on the floating gate 24 of the selected cell determine the conductivity of the cell. As in the case of programming, cells in the same selected row but at alternating columns can be read simultaneously.

column line $66_x$ connecting the drain regions 16 of the cells in that column$_x$, a second column line $62_x$ connecting the select gate 20 of the cells in that column$_x$, and another first column line $66_{x+1}$ connecting the source regions 14 of the cells in that column$_x$, with adjacent column of memory cells sharing a drain column line and a source column line. Each of the row lines 64 is connected to the control gate 30 of the memory cells in that row. Thus for each memory cells arranged in the same row, e.g. row$_y$, a row line $64_y$ connects all of the control gates 30 of all the cells in that row$_y$.

The array 250 also comprises a column decoder 54 which receives and decodes a column address signal and selects one of the plurality of first column lines 66. The array 250 has a row decoder 52 which receives and decodes a row address signal and selects a row line 64. The array 250 also

|  | Erase | | Program | Read |
|---|---|---|---|---|
|  | Alternative #1 | Alternative #2 | | |
| Selected Control Line ($64_1$) | 0 | ~-8 to -10 V | ~10 to 12 V | ~Vcc |
| Unselected Control Line | 0 | 0 | 0 | 0 |
| Selected Select Line ($62_2$) | 0 | 0 | Vt + ΔV1 | ~Vcc |
| Unselected Select Lines | 0 | 0 | 0 | 0 |
| Selected Left Bit Line ($66_2$) | ~Vcc or floating | ~Vcc or floating | 0 or ΔV2 | ~1 to 2 V |
| Selected Right Bit Line ($66_3$) | ~10 to 12 V | ~5 V or Vcc | ~5 to 10 V | 0 |
| Unselected Bit Lines | ~Vcc or floating | ~Vcc or floating | ~Vcc | 0 |

Figure 9:
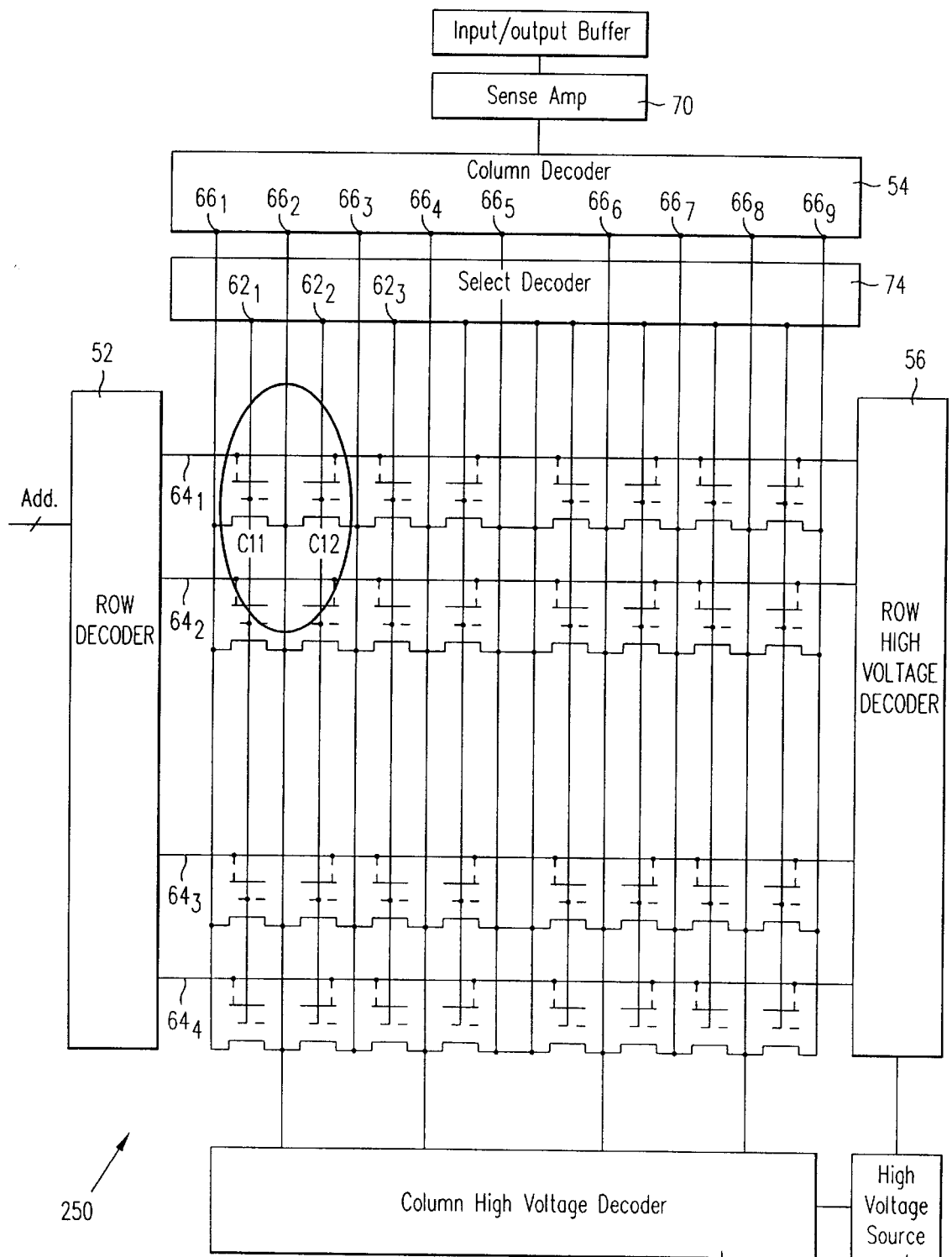
FIG. 9 is a block level schematic circuit diagram of a third embodiment of a memory array of the present invention, using any of the embodiments of the memory cell of the present invention shown in FIGS. 5(a), or 6.

A schematic circuit of a third embodiment of a memory array 250 of the present invention is shown in FIG. 9. The memory array 150 is suited for use with the memory cells 310 and 410.

The memory array 250 is similar to the array 150, and same numerals will be used to designate like parts. The array 150 is comprised of a plurality of memory cells 310 and 410, arranged in a matrix of a plurality of rows and columns. The memory array 250 has a plurality of first column lines $66_1 \ldots n$ and a plurality of second column lines $62_{1 \ldots n}$, and a plurality of row lines $64_{1 \ldots n}$. Each of the odd numbered first column line 66, e.g. $66_1$, $66_3$, etc., is connected to the drain region 16 of the memory cells 310 or 410 arranged in two columns. Each of the even numbered first column line 66, e.g. $66_2$, $66_4$, etc., is connected to the source region 14 of the memory cells 310 or 410 arranged in two columns. Thus, one drain column line, e.g. $66_3$ is shared between the cells in columns 2 and column 3. Similarly, one source column line, e.g. $66_2$ is shared between the cells in columns 1 and column 2. Each of the second column lines 62 is connected to the select gate 20 of the memory cells in that column. Thus, for each of the memory cells arranged in the same has a select decoder 74 which also receives the column address signals and selects one of the second column lines 62. A row high voltage decoder 56 is connected to the row lines 64 and supplies the high voltages from a high voltage source 72 to the selected row line 64. A column high voltage decoder 76 is connected to the first column lines 66 and supplies the high voltages from the high voltage source 72 to the selected first column line 66.

The operation conditions of the memory array 250 are similar to the memory array 150. However, because of the sharing of the source lines, and drain lines, during erase, each column pair of adjacent memory cells will be erased simultaneously. Further, the pair of adjacent column memory cells, which share the common source line, can be read simultaneously. In addition, similar to the operation for the array 150, multiple alternating column pairs in the same selected row can be programmed or read simultaneously. Further, as discussed previously, if negative bias on control line, i.e. row line 64, is used for erase operation, then a block erase mode is preferred to prevent disturb conditions. The operation conditions are listed in below.

|  | Erase | | Program | Read |
|---|---|---|---|---|
|  | Alternative #1 | Alternative #2 | | |
| Selected Control Line ($64_1$) | 0 | ~-8 to -10 V | ~10 to 12 V | ~Vcc |
| Unselected Control Line | 0 | 0 | 0 | 0 |
| Selected Select Line ($62_2$) | 0 | 0 | Vt + ΔV1 | ~Vcc |
| Unselected Select Lines | 0 | 0 | 0 | 0 |
| Selected Bit Line ($66_1$ and/or $66_3$) | ~Vcc or floating | ~Vcc or floating | 0 or ΔV2 | ~1 to 2 V |
| Unselected Bit Lines | ~Vcc or floating | ~Vcc or floating | ~Vcc | 0 or floating |
| Selected source Line ($66_2$) | ~10 to 12 V | ~5 V or Vcc | ~5 to 10 V | 0 |
| Unselected source Lines ($66_4$, $66_6$, etc.) | 0 | N/A[1] | 0 | 0 |

[1]-block erase is the preferred erase mode in this case, where all source lines in the same block are selected.

column, e.g. column$_x$ there are three column lines, a first

From the foregoing it can be seen that the present flash EEPROM memory cell and array can be operated with very low programming current so that it can be supported by an on-chip voltage multiplier from a single power supply. Further, the cell and the array have enhanced manufacturability and scalability.

In addition, because each memory cell has four terminals: source, drain, select gate, and control gate, the selection of a particular cell for programming is dependent only on the voltage applied to the particular select gate and the particular source. Accordingly, this permits a variable amount of voltage to be applied to the control gate, during programming, which controls the amount of electrons injected onto the floating gate. This permits more than one level of charge to be stored on the floating gate of each memory cell. The amount of charge stored on the floating gate determines the threshold voltage and the conductivity of the cell, which can be sensed by the sense amplifier 70. The threshold voltage of the cell after programming operation is to a first order linearly proportional to the control gate voltage multiplied by the coupling ratio, Rc, of the control gate.

Rc=C(f–cg)/(C(f–cg)+C(f–sel)+C(f–s)), where each capacitance element is defined previously. Thus, with the memory cell and memory array of the present invention, variable amount of electrons, representing multi-level bits, can be stored and read from the floating gate of each memory cell. In circuit operation, this can be implemented by first erasing all cells in a memory array to an erased state, then program a selected cell by adjusting the voltage level of the control gate according to a desired multiple level input data.

Furthermore, compared to the memory cell disclosed in U.S. Pat. No. 5,303,187, in the memory cell of the present invention, the potential for the erase operation is provided by either (1) the voltage difference between a smaller negative voltage at the control gate and a positive voltage at the source, or (2) a single positive voltage at the source. Both are easier to achieve in typical CMOS process because higher junction breakdown and field isolation voltages of NMOS transistors can be provided easier than those for PMOS transistors.

What is claimed is:

1. An electrically erasable and programmable read only memory cell comprising:
   a semiconductor substrate having a drain and a source, with a channel therebetween, with said source having a greater dopant concentration than said drain;
   a select gate over said substrate and insulated therefrom and extending over a first portion of said channel;
   a floating gate having a first portion over said select gate and insulated therefrom, and having a second portion insulated from said substrate and extending over a second portion of said channel and over a portion of said source and lies between said select gate and said source; and
   a control gate over said floating gate and insulated therefrom, and having a portion over said select gate with a first edge aligned with an edge of said select gate, and insulated therefrom, and a second edge aligned with an edge of said floating gate.

2. The cell of claim 1 wherein said select gate has a portion over said drain and is insulated therefrom.

3. The cell of claim 1 wherein said control gate has a portion extending over a portion of said source and is insulated therefrom.

4. The cell of claim 3 wherein said control gate extends over all of the source.

5. The cell of claim 3 wherein said control gate further having a portion over said substrate and insulated therefrom, and extending over a third portion of said channel, said third portion of said channel between said select gate and said drain.

6. The cell of claim 5 wherein said select gate has an edge aligned with an edge of the first portion of the floating gate.

7. An electrically erasable and programmable read only memory cell comprising:
   a semiconductor substrate having a first region and a spaced apart second region, with a channel therebetween, said channel is of a first conductivity type, with said first region made by implanting dopants of a second conductivity type, and with said second region made by implanting dopants of said second conductivity type to a first level, and implanting dopants of said second conductivity type to a second level, deeper than said first level;
   a select gate over said substrate and insulated therefrom and extending over a first portion of said channel;
   a floating gate having a first portion over said select gate and insulated therefrom, and having a second portion insulated from said substrate and extending over a second portion of said channel and over a portion of said second region and lies between said select gate and said second region; and
   a control gate over said floating gate and insulated therefrom.

8. The cell of claim 7 wherein said first region is drain and said second region is source.

9. The cell of claim 8 wherein said select gate has a portion over said drain and is insulated therefrom.

10. The cell of claim 8 wherein said control gate has a portion over said select gate and is insulated therefrom.

11. The cell of claim 10 wherein said control gate has a first edge aligned with an edge of said select gate, and a second edge aligned with an edge of said floating gate.

12. The cell of claim 8 wherein said control gate has a portion extending over a portion of said source and is insulated therefrom.

13. The cell of claim 12 wherein said control gate extends over all of the source.

14. The cell of claim 12 wherein said control gate further having a portion over said substrate and insulated therefrom, and extending over a third portion of said channel, said third portion of said channel between said select gate and said drain.

15. The cell of claim 14 wherein said select gate has an edge aligned with an edge of the first portion of the floating gate.

16. An electrically erasable and programmable read only memory cell comprising:
   a semiconductor substrate having a first region and a spaced apart second region, with a channel therebetween, said channel is of a first conductivity type, with said first region being of a second conductivity type extending to a first level, and with said second region being of said second conductivity type extending to a second level deeper than said first level;
   a select gate over said substrate and insulated therefrom and extending over a first portion of said channel;
   a floating gate having a first portion over said select gate and insulated therefrom, and having a second portion insulated from said substrate and extending over a second portion of said channel and over a portion of said second region and lies between said select gate and said second region; and a control gate over said floating gate and insulated therefrom.

17. The cell of claim 16 wherein said first region is drain and said second region is source.

18. The cell of claim 17 wherein said select gate has a portion over said drain and is insulated therefrom.

19. The cell of claim 17 wherein said control gate has a portion over said select gate and is insulated therefrom.

20. The cell of claim 19 wherein a portion of said control gate is over a portion of said floating gate, and another portion of said control gate is over a portion of said select gate.

21. The cell of claim 19 wherein said control gate has a first edge aligned with an edge of said select gate, and a second edge aligned with an edge of said floating gate.

22. The cell of claim 17 wherein said control gate has a portion extending over a portion of said source and is insulated therefrom.

23. The cell of claim 23 wherein said control gate extends over all of the source.

24. The cell of claim 22 wherein said control gate further having a portion over said substrate and insulated therefrom, and extending over a third portion of said channel, said third portion of said channel between said select gate and said drain.

25. The cell of claim 24 wherein said select gate has an edge aligned with an edge of the first portion of the floating gate.

26. The cell of claim 9 wherein a portion of said control gate is over a portion of said floating gate, and another portion of said control gate is over a portion of said select gate.

* * * * *

UNITED STATES PATENT AND TRADEMARK OFFICE
CERTIFICATE OF CORRECTION

PATENT NO.  : 5,912,843
DATED       : June 15, 1999
INVENTOR(S) : Ching-Shi Jenq It is certified that error appears in the above-identified patent and that said Letters Patent is hereby corrected as shown below:

<u>Title page,</u>
Item [75], inventor, "Ching-Shi Jeng" should read -- Ching-Shi Jenq --.

Signed and Sealed this

Fourth Day of March, 2003

JAMES E. ROGAN
*Director of the United States Patent and Trademark Office*